United States Patent [19]

Linford et al.

[11] Patent Number: 5,429,708

[45] Date of Patent: Jul. 4, 1995

[54] MOLECULAR LAYERS COVALENTLY BONDED TO SILICON SURFACES

[75] Inventors: Matthew B Linford, Salt Lake City, Utah; Christopher E. D. Chidsey, San Francisco, Calif.

[73] Assignee: The Board of Trustees of the Leland Stanford Junior University, Stanford, Calif.

[21] Appl. No.: 171,518

[22] Filed: Dec. 22, 1993

[51] Int. Cl.$^6$ ..................... H01L 21/306; B44C 1/22; C03C 15/00; C03C 25/06
[52] U.S. Cl. ..................................... 216/66; 216/67; 216/79
[58] Field of Search ............... 156/629, 633, 643, 647, 156/657, 662; 134/1; 204/192.37

[56] References Cited

U.S. PATENT DOCUMENTS 4,518,449  5/1985  Kamada ........................ 156/666 X
4,547,432  10/1985  Pitts et al. ...................... 156/663 X

OTHER PUBLICATIONS

M. R. Lindford, C. E. D. Chidsey, "Alkyl Monolayers Covalently Bonded to Silicon Surfaces", J. Am. Chem. Soc., 1993, 115, pp. 12631-12632.

C.-H. Chu, E. Jonsson, M. Auvinen, J. J. Pesek, J. E. Sandoval, "A New Approach for the Preparation of a Hydride-Modified Substrate Used as an Intermediate in the Synthesis of Surface-Bonded Materials", Anal. Chem. 1993, 65, pp. 808-816.

W. Widdra, C. Huang, G. A. D. Briggs, W. H. Weinberg, "Ethylene and Coabsorbed Hydrogen on Si(100)-(2X1): Structure, Bonding, and Decomposition", J. Elect. Spectr. Rel. Phen., 64/65 (1993), pp. 129-136.

J. T. Yates, Jr., C. C. Cheng, Q. Gao, M. L. Colaianni, W. J. Choyke, "Atomic H: A reagent for the extraction of chemical species from Si surfaces", Thin Solid Films, 225 (1993), pp. 150-154.

C. C. Cheng, P. A. Taylor, R. M. Wallace, H. Gutleben, L. Clement, M. L. Colaianni, P. J. Chen. W. H. Weinberg, W. J. Choyke, J. T. Yates, "Hydrocarbon surface chemistry on Si(100)", Thin Solid Films, 225 (1993), pp. 196-202.

J. J. Pesek, J. E. Sandoval, S. Minggong, "New alumina-based stationary phases for high-performance liquid chromatography. Synthesis by olefin hydrosilation on a silicon hydride-modified alumina intermediate", J. Chrom., 630 (1993) pp. 95-103.

C. W. Sheen, J.-X. Shi, J. Martensson, A. N. Parikh, D. L. Allara, "A New Class of Organized Self-Assembled Monolayers: Alkane Thiols on GaAs (100)", J. Am. Chem. Soc. 1992, 114, pp. 1514-1515.

P. A. Taylor, R. M. Wallace, C. C. Cheng, W. H. Weinberg, M. J. Dresser, W. J. Choyke, J. T. Yates, Jr., "Absorption and Decomposition of Acetylene on Si(100)-(2X1)", J. Am. Chem. Soc., vol. 114, No. 17, 1992, pp. 6754-6760.

V. A. Tertykh, L. A. Belyakova, A. V. Simurov, "Solid-Phase Hydrosilylation in Synthesis of Surface Compounds with a Si-C Bond", Dokl. Akad. Nauk. SSSR, 1991, vol. 318, No. 3, pp. 647-653.

B. E. Bent, C.-T. Kao, B. R. Zegarski, L. H. Dubois, R. G. Nuzzo, "Surface Reactions in the Aluminum-Catalyzed Direct Synthesis of Alkylsilanes", J. Am. Chem. Soc. 1991, 113, pp. 9112-9119.

(List continued on next page.)

Primary Examiner—William Powell
Attorney, Agent, or Firm—Leo V. Novakoski; Edward J. Radlo

[57] ABSTRACT

A method for producing a molecular layer of a selected molecular moiety (44) on a silicon surface (40) is provided in which a silicon surface (10) is etched to form a hydrogenated silicon surface and combined with a free radical-producing compound, where the free radical produced by the free radical-producing compound corresponds to the selected molecular moiety (44). The combined silicon surface and free radical-producing compound is then heated to sufficient temperature to initiate reaction between the free radical-producing compound and the hydrogenated silicon surface.

39 Claims, 9 Drawing Sheets

OTHER PUBLICATIONS

J. E. Sandoval, J. J. Pasek, "Hydrolytically Stable Bonded Chromatographic Phases Prepared Through Hydrosilation of Olefins on a Hydride–Modified Silica Intermediate", Anal. Chem. 1991, 63, pp. 2634–2641.

J. E. Sandoval, J. J. Pesek, "Synthesis and Characterization of a Hydride–Modified Porous Silica Material as an Intermediate in the Preparation of Chemically Bonded Chromatographic Stationary Phases", Anal. Chem. 1989, 61, pp. 2067–2075.

R. Abuelafiya, J. J. Pesek, "Synthesis of Chemically Bonded Polystyrene–Divinylbenzene on Silica by Free Radical Initiation with Gamma Radiation Cross-Linking", J. Liq. Chrom., 12(9), (1989), pp. 1571–1576.

J. J. Pasek, G. Guiochon, "The Allyl–Bonded Stationary Phase. III. In Situ Conversion to a Cation–Exchange Material", J. Chrom., 395 (1987), pp. 1–7.

J. J. Pesek, P. Mahabadi, S.-J. Chan, "The Allyl Bonded Stationary Phase. II. Conversion to New Phases for Gas Chromatography", Chromatographia, vol. 23, No. 1, Jan. 1987, pp. 3–6.

M. J. Bozack, P. A. Taylor, W. J. Choyke, J. T. Yates, Jr. "Alkyl Radical Involvement in Silicon Surface Chemistry", Surface Sciences 179, (1987), pp. 132–142.

J. J. Pesek, S. A. Swedberg, "Allyl–Bonded Stationary Phase as Possible Intermediate in the Synthesis of Novel High–Performance Liquid Chromatographic Phases", J. Chrom., 361 (1986), pp. 83–92.

A. M. Spool; K. A. Daube, T. E. Mallouk, J. A. Belmont, M. S. Wrighton, "Reaction of the (111) Faces of Single–Crystal Indium Phosphide with Alkylating Agents: Evidence of Selective Reaction of the P–Rich Face", J. Am. Chem. Soc. 1986, 108, pp. 3155–3157.

M. J. Bozack, P. A. Taylor, W. J. Choyke, J. T. Yates, Jr., "Chemical Activity of the C=C double bond on silicon surfaces", Surface Science 177 (1986), pp. L933–L937.

T. Koenig, "The Decomposition of Peroxides and Azoalkanes" published in Free Radicals, by J. K. Kochi, vol. 1, Chptr. 3, Wiley, N.Y., 1973, pp. 113–120.

G. W. Cullen, J. A. Amick, D. Gerlich, "The Stabilization of Germanium Surfaces by Ethylation. I. Chemical Treatment. II. Chemical Analysis, III. Electrical Measurements", J. Electrochem. Soc. 1062, 109, pp. 124–138.

J. L. Speier, R. Zimmerman, J. Webster, "The Addition of Silicon Hydrides to Olefinic Double Bonds. Part I. the Use of Phenylsilane, Diphenylsilane, Phenylmethylsilane, Amylsilane and Tribromosilane", J. Am. Chem. Soc., 1956, vol. 78, pp. 2278–2281.

L. H. Sommer, E. W. Pietrusza, F. C. Whitmore, "Peroxide–Catalyzed Addition of Trichlorosilane to 1–Octene", J. Am. Chem. Soc., 1947, vol. 69, p. 188.

A. J. Barry, L. DePree, J. W. Gilkey, D. E. Hook, "The Reaction of Olefins and Chlorohydrosilanes", J. Am. Chem. Soc., 1947, vol. 69, p. 2916.

C. A. Burkhard, R. J. Krieble, "Alkylation of Hydrochlorosilanes", J. Am. Chem. Soc., 1947, vol. 69, pp. 2687–2689.

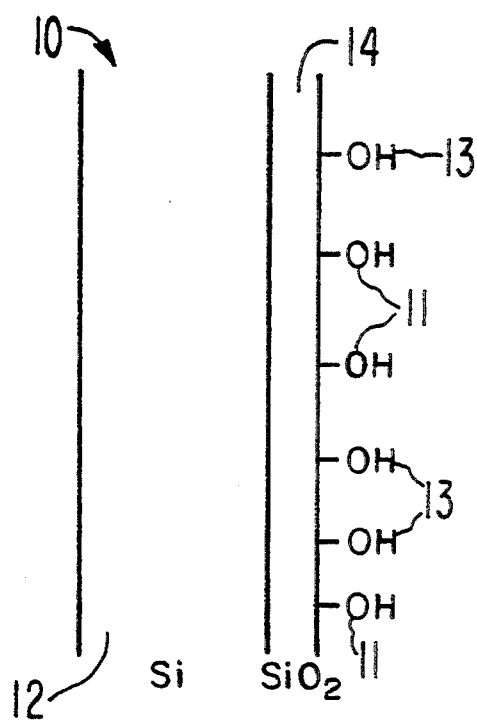
FIG.1A
FIG.1B
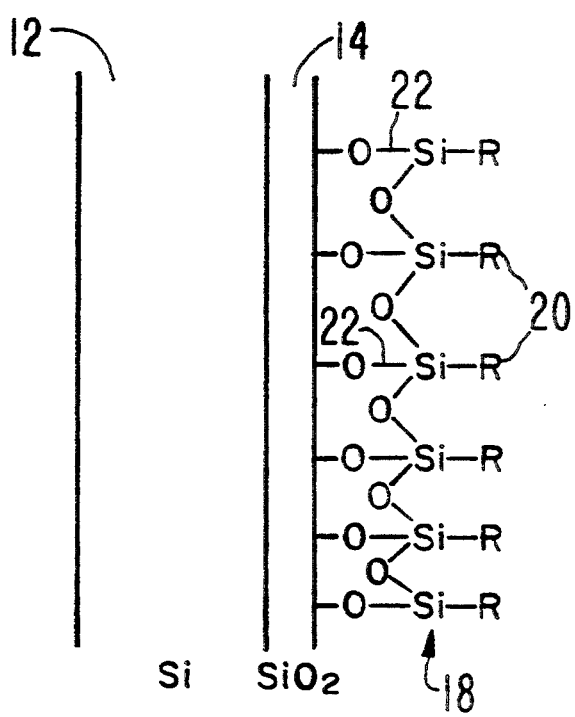

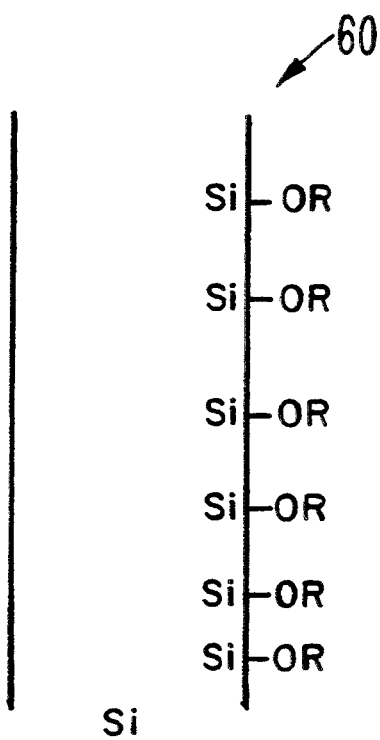
FIG.5
FIG.6
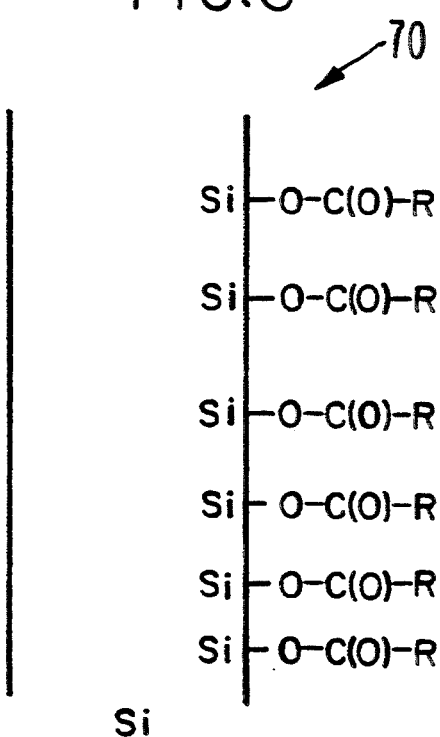

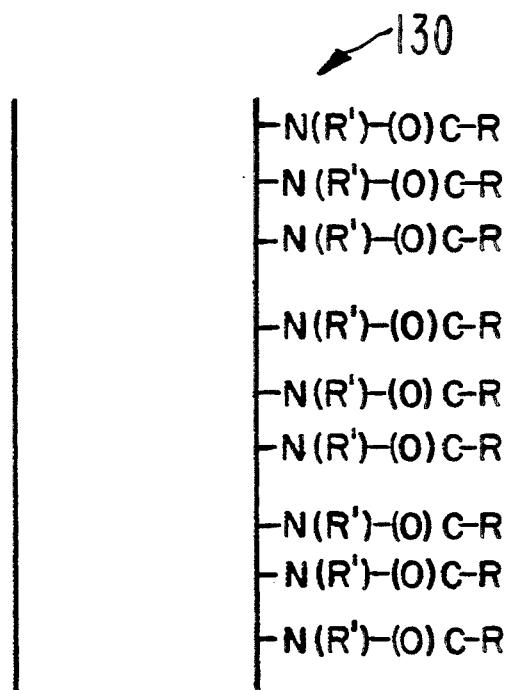
FIG.9
FIG.10
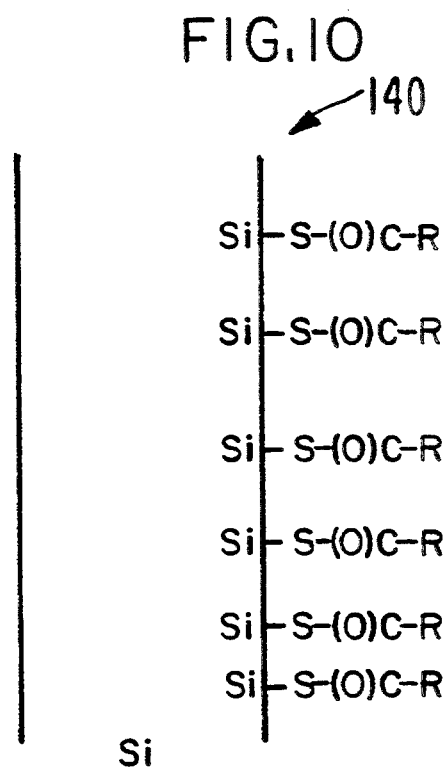

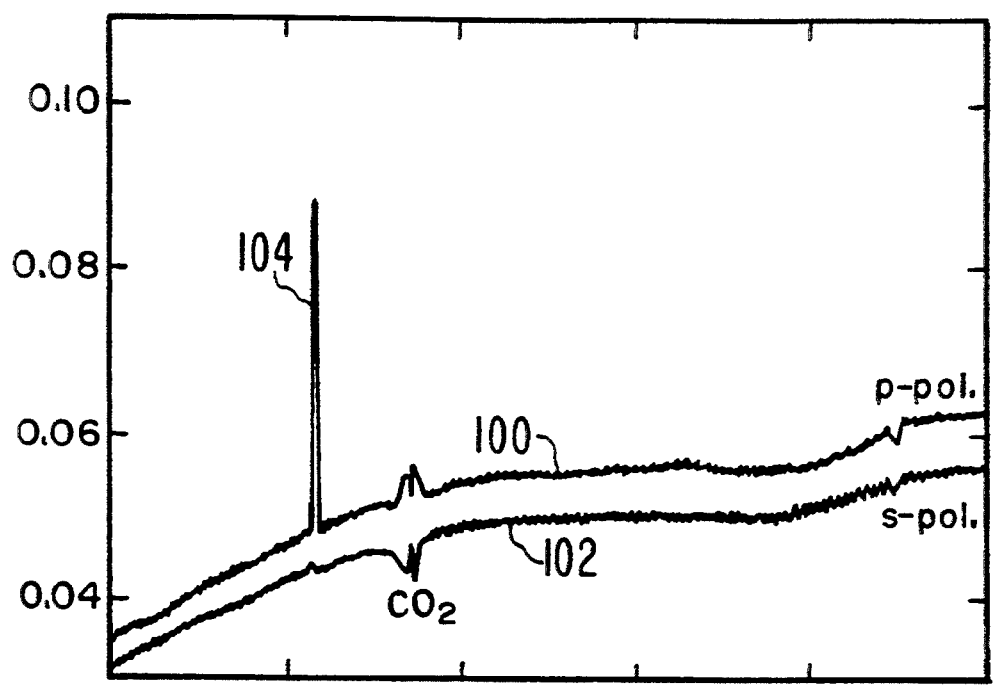
FIG.13
FIG.14
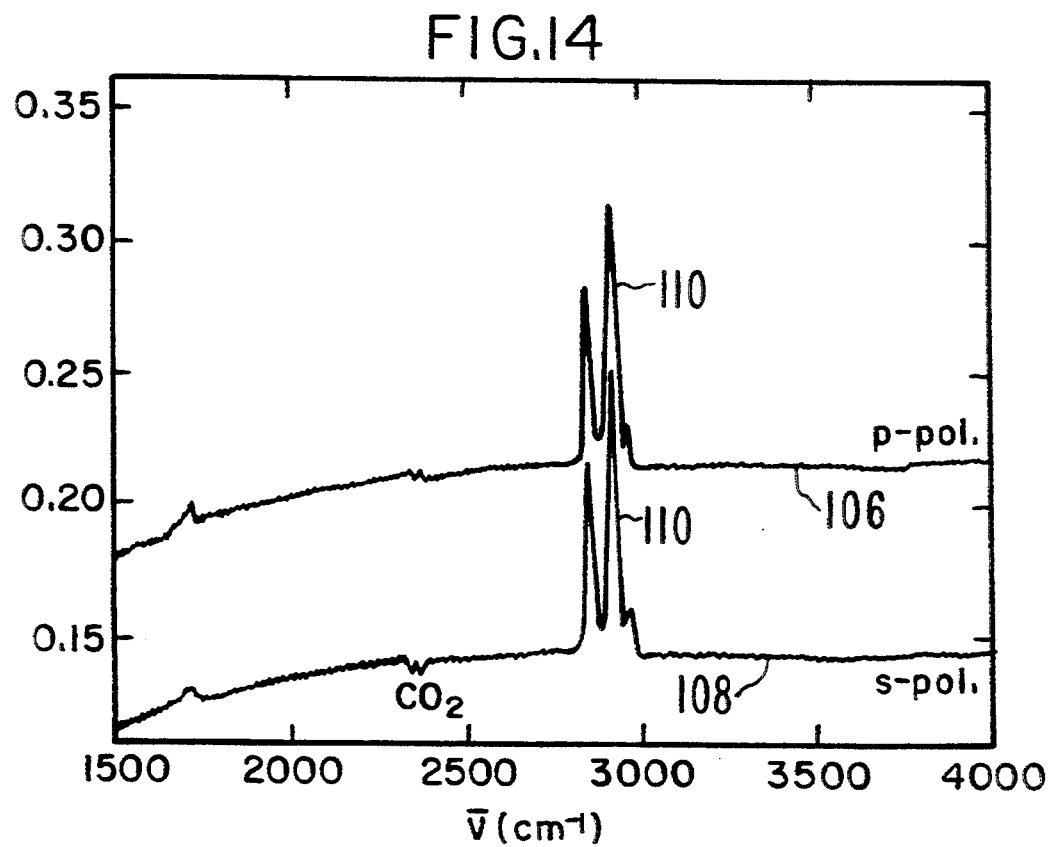

5,429,708

MOLECULAR LAYERS COVALENTLY BONDED TO SILICON SURFACES

TECHNICAL FIELD

This invention relates to silicon having selected molecular moieties bonded directly to the silicon surface, and in particular to silicon having selected molecular moieties covalently bonded to the silicon surface in up to monolayer coverage and methods for making the same.

BACKGROUND ART

Silicon materials are used in a wide variety of technical applications, including for example, electronic devices, solar cells, chemical sensors, micro-mechanical devices, and electrochemical cells. These and other applications employ different forms of silicon materials, such as single crystal or polycrystalline silicon, amorphous silicon, silicon nanocrystals, porous silicon materials, or thin films of any of these forms of silicon. In many applications, it is useful to be able to modify the chemical or physical properties of the silicon surface according to the function it is to perform. For example, the surfaces of silicon chips are selectively masked prior to doping in the manufacture of electronic devices; and silicon surfaces in chemical sensors may be chemically treated to enhance their performance. In addition to these known modifications of silicon surfaces, new applications may be facilitated by expanding the methods available for processing silicon surfaces. For example, it is desirable to develop methods for treating the surfaces of micro-mechanical devices fabricated from silicon to minimize stiction.

The chemistry necessary to modify silicon depends on the material forming the surface of the silicon material. Since silicon is readily oxidized under ambient conditions, the surfaces of many solid silicon materials include overlayers of $SiO_2$. Consequently, much of the chemistry of silicon surfaces is largely that of reactions with the $SiO_2$ overlayer of the oxidized silicon. For example, oxidized silicon reacts with trichlorosilanes, trimethoxysilanes, triethoxysilane, and other silanes having hydrolyzable substituents. Such reactions are of significance to the fiberglass industry and can be used to generate self-assembled monolayers on the oxidized silicon surfaces. The etching of oxidized silicon surfaces to form hydrogen-terminated silicon surfaces is also known.

In addition to the formation of self assembled monolayers on oxidized silicon surfaces, reactions between certain hydrocarbons and clean silicon surfaces have been studied. These reactions are typically carried out with a single crystal silicon surface maintained under ultra high vacuum (UHV) conditions while gas phase reactants such as propylene, ethylene, and acetylene are dosed onto the silicon surface. These reactions typically produce low coverages of small, volatile, Si bonded alkyl chains, and at higher temperatures, SiC. In general, UHV systems are limited to reactions involving smaller hydrocarbon molecules such as those identified above. Further, such gas phase methods may not be suitable for generating self-assembled molecular layers on surfaces because the mechanism by which self-assembly occurs does not necessarily operate effectively in the low density gas phase. There is thus a need for new methods of chemically and physically modifying silicon surfaces by forming molecular layers of any desired size and molecular consistency, both to improve the performance of silicon in present applications and to develop new applications of silicon materials.

DISCLOSURE OF THE INVENTION

A method is presented for covalently bonding selected molecular moieties (44) to a silicon surface (30, 38) to form a molecular layer on the silicon surface (30, 38). In accordance with the method of the present invention, a silicon surface (10) is first etched to remove any oxide overlayer (14). The etched surface (30, 38) is then combined with a free radical-producing compound that will generate the selected molecular moiety (44) when activated by heat or light. Bonding between the silicon atoms (32) of the etched silicon surface (30, 38) and the selected molecular moieties (44) is then initiated by applying thermal energy or electromagnetic radiation to the wetted silicon surface (42).

An alternative method for covalently bonding selected molecular moieties (44) to a silicon surface (30, 38)) combines an unsaturated compound, or a combination of an unsaturated compound and the free radical generating compound with the etched silicon surface (30, 38) prior to initiating the reaction. As with the free radical generating reagents, reaction of the wetted silicon surface (42) with unsaturated compounds or with combined unsaturated compounds and free radical generating compounds may be initiated by electromagnetic radiation or heat. In addition, reactions with unsaturated compounds may be initiated by catalyisis using certain bases or free radical-producing compounds The method of the present invention may be employed to produce compositions in which selected molecular moieties (44) are covalently bonded to a silicon surface (30, 32) to form a stable molecular layer of the selected molecular moieties on the silicon surface (30, 38). In addition, by providing the selected molecular moieties (44) with appropriate terminal groups (46), the molecular layer of molecular moieties (44) covalently bonded to silicon can be extended by subsequent reactions to form a molecular layer of yet longer chain molecular moieties (44') having different properties at different distances from the silicon surface (30, 32).

BRIEF DESCRIPTION OF THE DRAWINGS

FIG. 1A is a schematic diagram of an untreated, oxidized silicon surface.

FIG. 1B is a schematic diagram of an oxidized silicon surface following reaction with a silane reactant having up to three hydrolyzable substituents.

FIG. 5 is a schematic diagram of a silicon surface in which a molecular layer of an organic radical of the form R—O— is bonded to the surface silicon atoms.

FIG. 6 is a schematic diagram of a silicon surface in which a molecular layer of organic radicals of the form R—C(O)—O— is bonded to the surface silicon atoms.

FIG. 9 is a schematic diagram of a silicon surface in which a molecular layer of organic radicals of the form R—C(O)—N(R')— is bonded to the surface silicon atoms.

FIG. 10 is a schematic diagram of a silicon surface in which a molecular layer of organic radical of the form R—C(O)—S— is bonded to the surface silicon atoms.

FIG. 13 is a schematic diagram of s- and p- polarized attenuated-total-internal-reflection infrared spectra (IR spectra) of a hydrogenated Si(111) surface (H—Si(111)).

FIG. 14 is a schematic diagram of s- and p-polarized IR spectra of a Si(111) surface including a monolayer of covalently bonded molecular moieties in accordance with the present invention.

DETAILED DESCRIPTION OF THE PREFERRED EMBODIMENTS

Figure 2A:
FIG. 2A is a schematic diagram of a silicon surface following etching to form a hydrogenated silicon surface.

Referring to FIG. 1A, there is shown a schematic diagram of an untreated silicon surface 10 as it typically appears. Silicon surface 10 includes substantially pure silicon material 12 having an $SiO_2$ overlayer 14, which forms spontaneously by reaction between pure silicon material 12 and ambient oxygen. Surface oxygen atoms 11 are often terminated with hydrogen atoms 13 as indicated.

Referring now to FIG. 1B, there is shown oxidized silicon surface 10 following conventional treatment with a silane reactant 16 such as trichlorosilane, trimethoxysilane, or triethoxysilane to form an organic layer 18 on silicon surface 10. Fragments 20 of silane reactant 16 form covalent bonds 22 to $SiO_2$ overlayer 14 of silicon surface 10 and are not directly bonded to the underlying layer of pure silicon material 12.

Referring now to FIG. 2A, there is shown a hydrogenated silicon surface 30 which may be formed for example by treating oxidized silicon surface 10 with an etching agent. In hydrogentaed silicon surface 30, surface silicon atoms 32 are terminated with hydrogen atoms 34 to form surface hydride $SiH_n$ 36, where n is 1, 2, or 3 depending on the type of etch used. For example, etching a Si(111) surface with 40% $NH_4F$ for a few minutes yields a monohydride SiH. Alternatively, aqueous HF may be used as an etching agent to yield various silicon hydrides ($SiH_n$) 36 on different silicon surfaces. In general, any of a variety of etching agents, including for example most aqueous bases, may be used to prepare hydrogenated silicon surface 30.

Figure 2B:
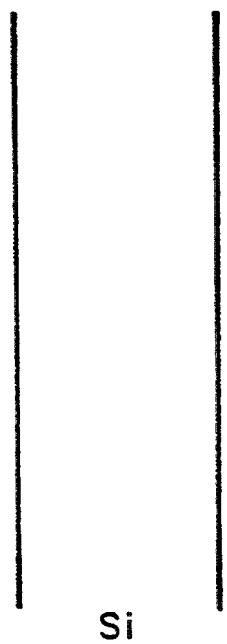
FIG. 2B is a schematic diagram of a clean silicon surface following etching to remove any $SiO_2$ overlayer.

Referring now to FIG. 2B, there is shown a schematic diagram representing a clean silicon surface 38 which may or may not be reconstructed. Clean silicon surface 38 may be generated for example by subjecting oxidized silicon surface 10 to plasma or ion etching, sputtering or for sufficiently lighlty oxidized silicon surfaces, heating to temperatures greater than about 900° C. The methods of the present invention is suitable for generating molecular layers on clean silicon surfaces 38 as well as hydrogenated silicon surfaces 30. However, in the former case, care must be exercised to avoid reoxidation of clean silicon surface 38 between the time it is etched and the time it is wetted with a reagent solution. This can be accomplished for example by performing the etching and wetting steps under an inert gas atmosphere. The methods of the present invention are also suitable for use with oxidized silicon surfaces.

Figure 3:
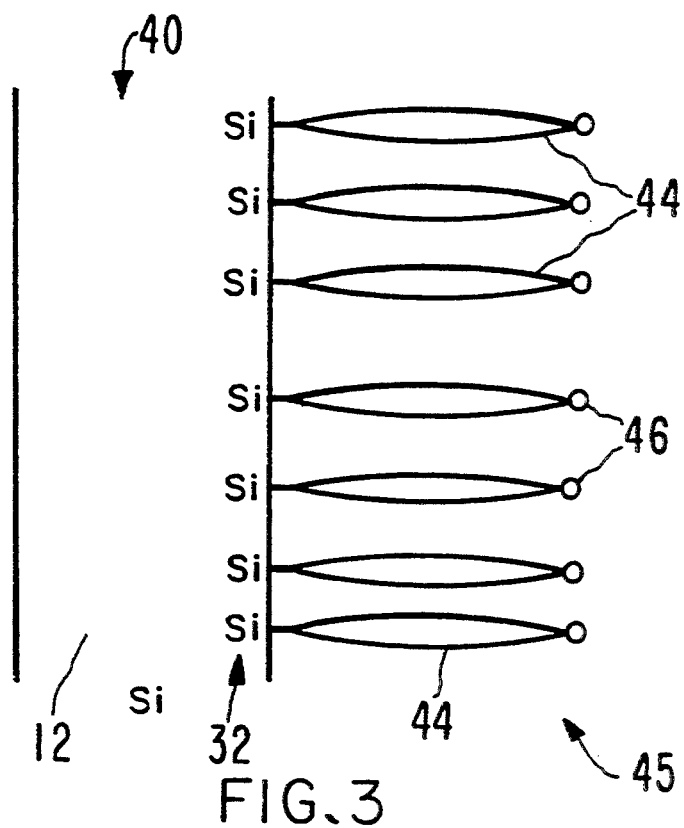
FIG. 3 is a schematic diagram of a silicon surface in which a molecular layer of selected molecular moieties is bonded to the surface silicon atoms.
Figure 4:
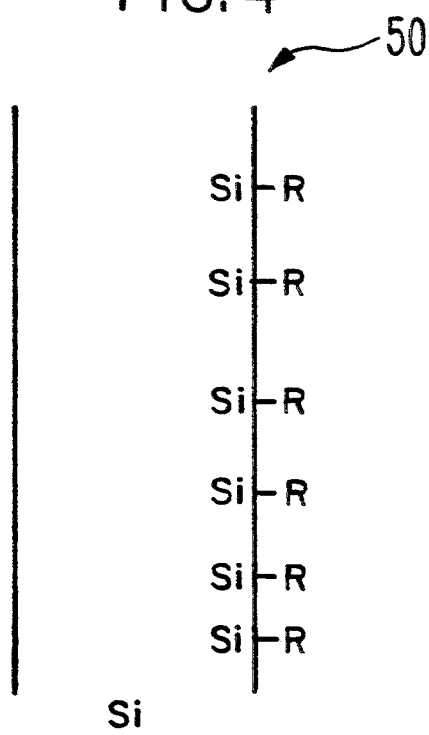
FIG. 4 is a schematic diagram of a silicon surface in which a molecular layer of organic radicals of the form R— are bonded to the surface silicon atoms.
Figure 7:
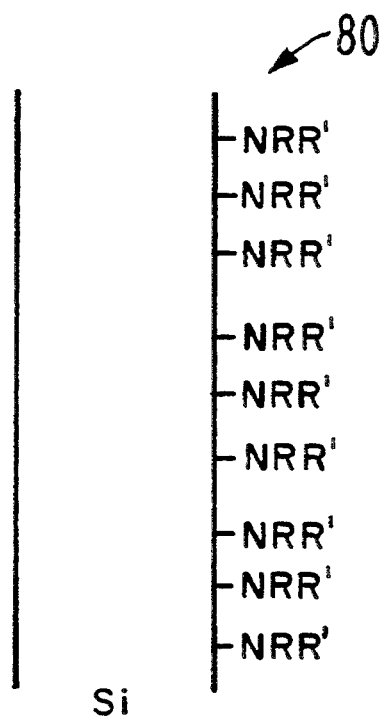
FIG. 7 is a schematic diagram of a silicon surface in which a molecular layer of organic radicals of the form R(R')N— is bonded to the surface silicon atoms.
Figure 8:
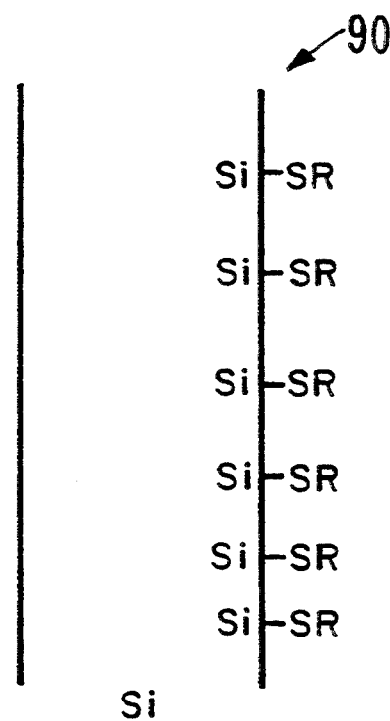
FIG. 8 is a schematic diagram of a silicon surface in which a molecular layer of organic radicals of the form R—S— is bonded to the silicon surface atoms.

Referring now to FIG. 3, there is shown schematic representation of a silicon surface 40 formed in accordance with the present invention by wetting hydrogenated silicon surface 30 or clean silicon surface 38 with an appropriate reagent and initiating a reaction with heat or light. Silicon surface 40 has selected molecular moieties 44 directly bonded to surface silicon atoms 32 to form molecular layer 45. The structure of molecular moiety 44 is determined by the reactant with which silicon surface 40 is combined. For example, molecular moiety 44 may be a substituted or unsubstituted organic radical bonded to surface silicon atom 32 through a Si—C, Si—O—, Si—S, Si—N, or Si—P bond. Also indicated in FIG. 3 is terminal position 46 of molecular moiety 44. As discussed below, reagents may be selected to provide molecular moieties 44 having functional groups in terminal position 46 with which additional molecular moieties 44' may react. Such additional molecular moieties 44' extend the length of molecular moiety 44 and allow variations in the physical and chemical properties of molecular layer 45 with distance d from surface silicon atoms 32.

Figure 11:
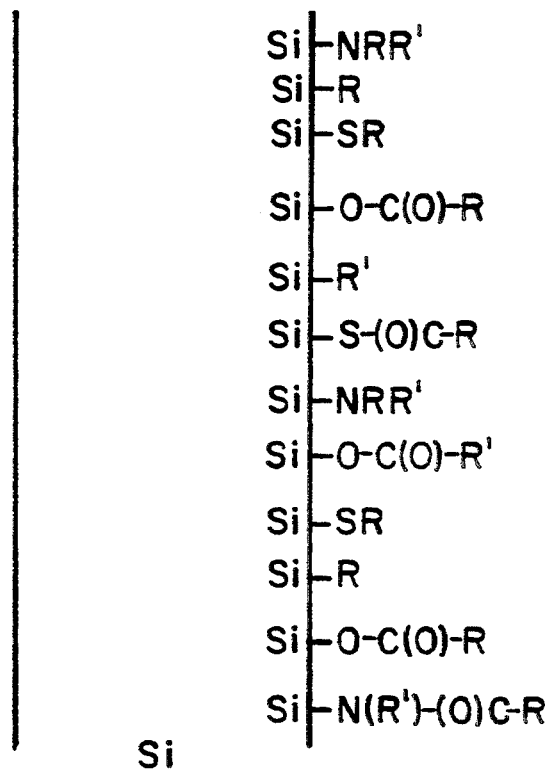
FIG. 11 is a schematic diagram of a silicon surface in which a molecular layer of organic radicals of the form R—O—, R—C(C)—O—, R(R')N—, and R—S— is bonded to the surface silicon atoms.

Referring now to FIGS. 4, 5, 6, 7, 8.9, and 10 there are shown schematic representations of silicon surfaces 50, 60, 70, 80, 90, 130, 140 to which molecular moieties 44 of the form R—, R—O—, RC(O)—O—, R(R')N—, R—S—, R—C(O)—N(R')—, and R—C(O)—S—, respectively, have been bonded. Here, R and R' represent various substituted and unsubstituted organic radicals, as discussed below. FIG. 11 shows a silicon surface to which a combination of different molecular moieties 44 have been bonded. Silicon surfaces 40, 50, 60, 70, 80, 90, 100, 130, 140 are generated by combining hydrogenated silicon surface 30 or clean silicon surface 38 with reactants which provide selected molecular moieties 44 on exposure to heat or light. For example, free radical-producing compounds may serve as the source of molecular moieties 44 by selecting a free radical-producing compound that generates the desired molecular moiety 44 when exposed to heat or light of the appropriate wavelength.

Illustrative of the sources of radicals R— and R—O— for bonding to surface silicon atoms 32 are the diacylperoxides of formula I, the peroxides of formula II, and the azo compounds of formula III:

R—C(O)—O—O—C(O)—R',     (I)

$$R-O-O-R', \quad (II)$$

$$R-N=N-R'. \quad (III)$$

In each case, R, R' may be selected from the substituted or unsubstituted organic radicals, including but not limited to alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, or cyano organic radicals. Perhalogenated and perdeuterated forms of these radicals may also be used. Further, one of R or R' may be hydrogen.

In addition to the above mentioned free radical generating compounds, unsaturated compounds may serve as sources for selected molecular moieties 44 for bonding to silicon surface atoms 32. For example, substituted and unsubstituted alkenes, alkynes, cyano compounds, and isonitrile compounds of formulas IV, V, VI, and VII, respectively;

$$R-(H)C=C(H)-R', \quad (IV)$$

$$R-C\equiv C-R', \text{ and} \quad (V)$$

$$R-C\equiv N, \quad (VI)$$

$$R-N\equiv C, \quad (VII)$$

may be used as sources of selected molecular moieties: —C(H)(R)—CH$_2$(R') and —CH(R')—CH(R); —C(R)=CH(R') and —C(R')=CHR; —CR=NH, and —N=CH(R); and —C=N—R, respectively. Here, the leading "—" represents the point of attachment to the silicon surface. Mixtures of any of the reactants of formulas I–VI may be employed to generate silicon surfaces 100 having a mixture of molecular moieties 44 bonded to surface silicon atoms 32. In addition, molecular layers of polymers may be formed by initiating polymerization reactions of appropriately selected, unsaturated monomers on silicon surfaces 30, 38 in accordance with the method of the present invention. For example, heating or irradiation of free-radical producing compounds leads to reaction of silicon surfaces 30, 38 with unsaturated compounds, which may then continue reacting with other unsaturated compounds in the reaction mixture.

If appropriate protective groups are used, R, R' may include functional groups that would otherwise react under the condition of the reactions disclosed in the present invention. Such functional groups in terminal position 46 of molecular moieties 44 can be regenerated following addition of molecular moieties 44 to silicon surface atoms 32 to provide a reactive site for the extension and modification of the initially attached layer of molecular moieties 44. Suitable function groups for this purpose include for example ethers, alcohols, esters, thiols, amines, thiols, halides, and acids, some of which may have to be protected during the reaction to bond molecular moieties 44 to the silicon surface 30, 38.

Figure 12:
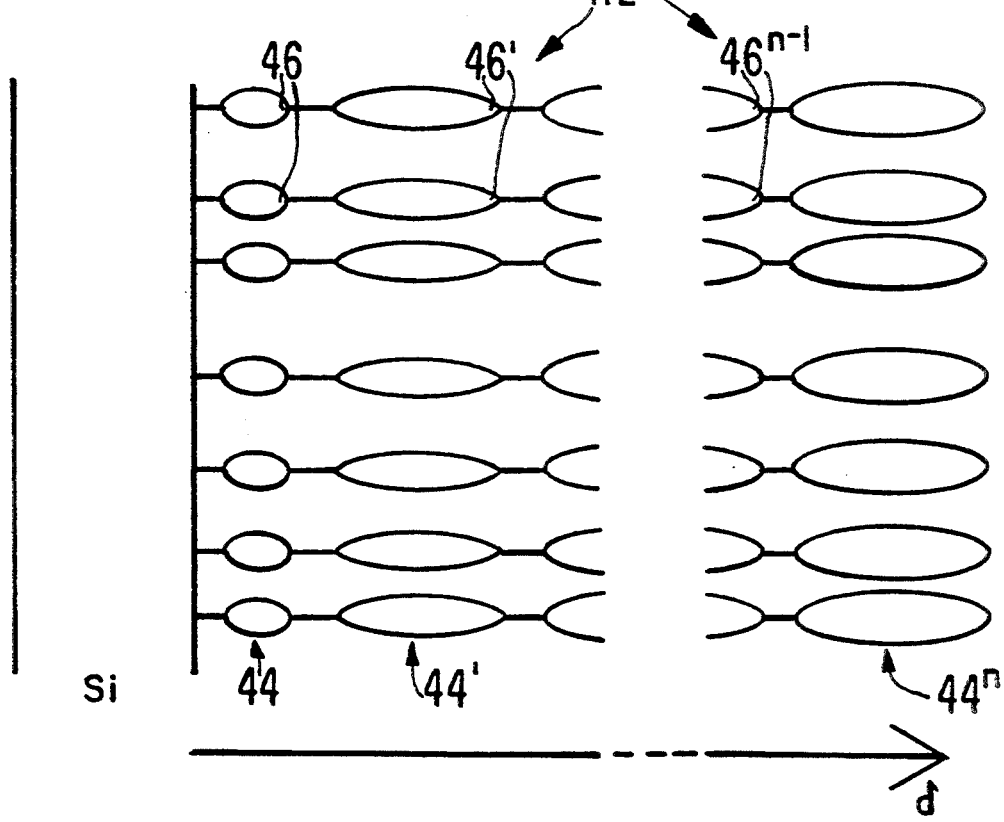
FIG. 12 is a schematic diagram of a silicon surface in which a modified surface layer has been covalently bonded to the silicon surface atoms by attaching to the silicon surface a molecular layer of molecular moieties having functional groups in their terminal positions which may undergo subsequent reactions to bond additional molecular moieties having similar function groups in their terminal positions to the terminal positions.

Referring now to FIG. 12, there is shown a modified surface layer 112 comprising different molecular moieties 44, 44', . . . 44$^n$ in accordance with the present invention. Modified surface layer 112 may be generated by series of reactions on the functional groups at terminal positions 46, 46' . . . 46$^{n-1}$ to sequentially attach molecular moieties 44', 44" . . . 44$^n$, respectively, to the terminal positions 46, 46' . . . 46$^{n-1}$ of molecular moieties 44, 44', 44", . . . 44$^{n-1}$. The physical and chemical properties of molecular moieties 44, 44', 44", . . . 44$^n$ provide a means to vary the properties of modified surface layer 112. subsequent to their attachment to the silicon surface. Such chain extending reactions involve ethers, alcohols, esters, thiols, amines, acids, and other functionalities at terminal position 46. These reactions are well known in the art and not considered further here.

In accordance with the method of the present invention, hydrogenated silicon surface 30 or clean silicon surface 38 is placed in a reaction vessel and wetted with a reagent mixture comprising one or more of free radical generating compounds I–III and unsaturated compounds IV–VII. Sufficient amounts of the reagent mixture are provided so that silicon surface 30, 38 is fully wetted. Often it is desirable to maintain silicon surface 30, 38 and reagent mixture under an inert atmosphere in the reaction vessel, to minimize oxidation of silicon surfaces 30, 38 prior to and during the reaction.

To initiate the reaction, the temperature of the reaction vessel may be raised to sufficient temperature to induce bonding between silicon surface 30, 38 and selected molecular moieties 44 provided by the reagent mixture. This temperature depends on the particular compound(s) I–VI selected for the reagent mixture and is typically in the range of between about 80° C. and 400° C. Alternatively, the reactants may be exposed to light in the microwave, infrared, visible, or ultraviolet wavelength region of the electromagnetic spectrum. Where unsaturated reactants IV–VII are employed as the source of molecular moieties 44, the reaction with silicon surfaces 30, 38 may be initiated by catalysis using free radical precursors or tertiary bases such as tertiary amines. Typically, the reaction is completed in approximately one hour, after which the treated silicon surface 40 may be washed with solvents to remove excess reactants and by-products.

The method of the present invention is now described in detail for single crystal silicon with the Si(111) face forming the silicon surface and a diacylperoxide as the free radical generating compound. However, the method applies equally to any form of solid silicon, including but not limited to polycrystalline silicon, amorphous silicon, porous silicon, silicon nanocrystals, and thin films of any of these forms of silicon, and to any of free radical generating compounds I–III and unsaturated compounds IV–VI.

As a preliminary step, the silicon is cleaned by immersing it in a hot 1:3 mixture of 30% H$_2$O$_2$ and concentrated H$_2$SO$_4$ for approximately two hours, followed by approximately 10 minute immersion in a 1:1 mixture of 30% H$_2$O$_2$ and concentrated NH$_4$OH. The surface is then reimmersed in the H$_2$O$_2$/concentrated H$_2$SO$_4$ mixture for about fifteen minutes. The silicon surface is rinsed thoroughly with water following immersion in each bath. Following the final water rinse, the silicon material is dried and etched in a solution of approximately 40% NH$_4$F for approximately four minutes. X-ray photoelectron spectra (XPS) of the silicon material after cleaning and etching do not exhibit the chemically shifted Si (2p) peak attributable to SiO$_2$. The absence of the peak indicates that much less than a monolayer of SiO$_2$ is present on the surface of the silicon material.

Referring now to FIG. 13 there are shown p- and s-polarized attenuated-total-internal-reflection (ATR) infrared (IR) spectra 100, 102, respectively, of the hydrogenated Si(111) surface (H—Si(111)) formed by etching. The presence of absorption peak 104 at 2083.9 cm$^{-1}$ in p-polarized spectrum 100 and the absence of a corresponding absorption peak in s-polarized spectrum 102 indicate that the only significant hydride species on hydrogenated Si(111) surface are monohydride SiH bonds (36 in FIG. 2) oriented perpendicular to the (111) surface of the silicon crystal. Corresponding spectra for H—Si(100) surfaces showed peaks due to SiH$_n$ (n=1, 2, 3) as expected.

A sample of silicon with the hydrogenated silicon surface is placed in a reaction vessel with sufficient solid [CH$_3$(CH$_2$)$_m$C(O)O]$_2$, where m is 16 or 10, to completely cover the silicon sample when it is heated above its melting point. The reaction vessel is then evacuated with a liquid nitrogen trapped mechanical pump, heated to between about 75° C. and about 80° C. to melt the solid [CH$_3$(CH$_2$)$_m$C(O)O]$_2$ and wet the Si(111) surface, and back-filled with argon gas. The reaction vessel is then heated further to between approximately 90° C and approximately 100° C. to pyrolyse the solid [CH$_3$(CH$_2$)$_m$C(O)O]$_2$. Gas evolves vigorously for about the first ten minutes and then more slowly for approximately fifty minutes more, after which the sample is removed from the still molten reaction mixture, rinsed with a solvent such as hexane or ethanol, and placed in an ultrasonic bath of CH$_2$Cl$_2$ and sonicated for between approximately five minutes and ten minutes.

Referring now to FIG. 14, there are shown p- and s-polarized IR spectra 106, 108, respectively, of the sample formed from reaction between [CH$_3$(CH$_2$)$_m$C(O)O]$_2$ and H—Si(111) ([CH$_3$(CH$_2$)$_m$C(O)O]$_2$/H—Si(111) system). Absorbance 110 at 2917.5 cm$^{-1}$ corresponds to the asymmetric methylene stretch and area 112 under absorbence 110 indicates that CH$_3$(CH$_2$)$_m$ and CH$_3$(CH$_2$)$_m$—(O)-C—O— from the [CH$_3$(CH$_2$)$_m$C(O)O]$_2$ source compound form a densely packed layer on the Si(111) surface. The thickness of the layer as measured by ellipsometry is approximately 25 Å for m=16, a value appropriate for such an array of densely packed, nearly perpendicular alkyl chains. Advancing contact angles, $\theta_a$, for water and hexadecane are typically 112° and 46°, respectively, indicating that the surface is methyl-terminated. XPS shows the presence of C(1s), O(1s), and Si(2p) peaks, but no discernible signal for F(1s) or oxidized Si (chemically shifted Si (2p)).

The two covalent linkages to the silicon surface generated from the reaction of [CH$_3$(CH$_2$)$_m$C(O)O]$_2$ and H—Si(111) are a Si—CH$_2$— bond and a Si—OC(O)CH$_2$— bond. The latter bonds make up approximately 30% of the molecular layer generated by the reaction between the acylperoxide and silicon surface 30, 38 and are readily removed by hydrolysis of the Si—OC(O)CH$_2$— linkage.

The physical properties of silicon surfaces prepared in accordance with the above method (molecular layers on silicon) are summarized in Table 1 along with the corresponding properties for similar chain-length trichlorosilanes on oxidized silicon (molecular layers on oxidized Si) and for thiols on gold (molecular layers on Au). IR spectra (position and area of absorbence), ellipsometry measurements, and advancing and retreating wetting angles ($\theta_{a/r}$) for monolayers of alkyl molecular moieties 44 on the three different surfaces (Si, SiO$_2$, and Au) are nearly identical for the 17 and 18 carbons chain molecular moieties 44, and indicate that all three monolayers are closely-packed methyl-terminated surfaces. For example, a well known empirical correlation exists between the position of the asymmetric methylene stretch absorption of hydrocarbon monolayers and the ordering (crystalline-like or liquid-like) of the monolayer. An asymmetric methylene stretch around 2916 cm$^{-1}$ corresponds to an ordered, crystalline-like hydrocarbon structure while an absorbence around 2925 cm$^{-1}$ corresponds to a less ordered, liquid-like hydrocarbon structure. Thus, absorptions in Table I which increase from approximately 2917.5 cm$^{-1}$ to about 2922.9 cm$^{-1}$ indicate a corresponding decrease in the order of the molecular layer from a crystalline like hydrocarbon layer to more liquid like hydrocarbon layer, as the length of the carbon chain is decreased.

It is generally accepted that an advancing water contact angle between about 111° and 115° and an advancing hexadecane contact angle between about 46° and 47° corresponds to a methyl terminated monolayer. Thus, the data of Table I indicate that silicon surface formed according to the above described method have molecular layers formed by methyl terminated molecular moieties 44.

TABLE I

| System | Asymmetric Methylene Stretch | | Contact Angles | | Thickness (Å) |
|---|---|---|---|---|---|
| | Position (cm$^{-1}$) | Area (arb.) | $\theta_{a/r}$(H$_2$O) | $\theta_{a/r}$(HD) | |
| [CH$_3$(CH$_2$)$_{16}$COO]$_2$/ H—Si(111) | 2917.5 | 1.81 | 112°/104° | 46°/43.5° | 25 |
| CH$_3$(CH$_2$)$_{17}$SH/Au | 2917.9 | | 114°/98.5° | 50°/40.5° | 28 |
| CH$_3$(CH$_2$)$_{17}$SiCl$_3$/ oxid. Si | 2917.3 | 1.81 | 112°/109° | 46.5°/45° | 25 |
| [CH$_3$(CH$_2$)$_{10}$COO]$_2$/ H—Si(111) | 2921.0 | 1.05 | 112°/103.5° | 40.5°/36° | 17 |
| [CH$_3$(CH$_2$)$_{10}$COO]$_2$/ H—Si(100) | 2922.9 | 1.08 | 112.5°/104° | 33°/30° | 16 ± 2 |
| CH$_3$(CH$_2$)$_{11}$SH/Au | 2919.2 | | 113.5°/103.5° | 47°/38.5° | 17 |
| CH$_3$(CH$_2$)$_{11}$SiCl$_3$/ oxid. Si | 2921.7 | 1.09 | 114°/112° | 42°/39° | 17 |

The nearest neighbor distance between silicon atoms on the Si(111) surface (3.84 Å) is too small to allow complete replacement of surface hydrogens by alkyl chains (diameter 4.6 Å[14]). Despite the fact that every site corresponding to a surface silicon atom may not be occupied, the method of the present invention still provides dense packing of extended molecular moieties 44 consistent with the above geometrical limitations, and these densely packed molecular moieties 44 provide a substantial chemical and mechanical barrier suitable for a variety of uses. For example, such molecular layers are suitable for use with: silicon based, micromechanical devices to minimize stiction; electrode surfaces to optimize their electrochemical properties for use in fuel cells or electrochemical synthetic cells; solar cells as an antioxidation coating, silicon chips as a monomolecular photoresist, and Si based chemical sensors to alter the electrical properties of the underlying Si.

In applications where termination of substantially all surface silicon atoms is desired, the extent of coverage may be increased by establishing a full monolayer of, for example, functionalized methyl group molecular moieties 44 and subsequently extending these moieties with subsequent chemical reactions, as discussed in conjunction with FIG. 10. Alternatively, silicon surfaces 30, 32 may be reacted with a mixture of source reagents that donate both methyl groups and other, larger molecular moieties 44 through constituents R and R'.

The stability of molecular layers on silicon formed from the longer-chain diacylperoxide ($m \geq 16$) and of $SiO_2$ monolayers formed from the longer trichlorosilane ($m \geq 17$) have been compared by immersing the treated surfaces in boiling chloroform for two hours and in boiling water for an additional hour. Comparison of IR measurements for similar molecular layers on silicon and on oxidized silicon are comparably robust. Following the chloroform and water immersions, the peak positions and areas of the asymmetric $CH_2$ stretch of the sample formed from $[CH_3(CH_2)_{16}C(O)O]_2$ and H—Si(111) shift from 2917.5 cm$^{-1}$ and 1.8 cm$^{-1}$, respectively, to 2919.9 cm$^{-1}$ and 1.2 cm$^{-1}$, while the peak positions and absorbence areas for the $CH_3(CH_2)_{17}SiCl_3$/oxid. Si system shift from 2917.3 cm$^{-1}$ and 1.8 cm$^{-1}$, respectively, to 2919.9 cm$^{-1}$, 1.5 cm$^{-1}$. Thus, similar effects are obtained for both surfaces. On the other hand, only 30 minutes in boiling $CHCl_3$ were required to alter the molecular layer formed by the $CH_3(CH_2)_{17}SH$/Au system so that the absorbence shifted from 2917.9 cm$^{-1}$ to 2920.9 cm$^{-1}$ and the coverage decreases by 30%.

The following additional, specific examples are presented to more particularly illustrate the invention, and should not be construed as being limitations on the scope and spirit of the invention.

EXAMPLE 1

A silicon surface is cleaned and etched as described above for the $[CH_3(CH_2)_{16}C(O)O]_2$/H—Si(111) system. The surface is then placed into a 50:50 degassed mixture of $[CH_3(CH_2)_{16}C(O)O]_2$ and decane, and the mixture is heated to approximately 100° C. for about an hour. The resulting surface is rinsed with solvents and placed in an ultra-sonic bath of methylene chloride for approximately five minutes. Fourier transform IR (FTIR) spectra, ellipsometric measurements, and contact angle measurement indicate that the surface formed is substantially identical to the methyl terminated, densely packed monolayer on silicon produced in the reaction with neat $[CH_3(CH_2)_{16}C(O)O]_2$.

EXAMPLE 2

A silicon surface is prepared in the manner described above and combined with a 50:50 mixture of $[CH_3(CH_2)_{16}C(O)O]_2$ and 1-octadecene in a reaction vessel. The combined silicon surface and 50:50 mixture is then heated to approximately 100° C. for about an hour and rinsed with solvents and sonicated as described in the preceding examples. FTIR, ellipsometry, and wetting measurements indicate that the resulting molecular layer is bonded to the silicon surface through Si—C bonds and terminated with methyl groups. FTIR spectra indicate that few if any carbon oxygen double bonds are present in the molecular layer. This is unlike the reaction with neat $[CH_3(CH_2)_{16}C(O)O]_2$ where approximately 30% of the bonds to the silicon surface involve Si—O—C(O)—R linkages. The resulting molecular layer is especially stable, remaining largely unchanged following two hours of boiling in chloroform and seven hours of boiling in water.

EXAMPLE 3

A silicon surface is prepared in the manner described above and combined with a 50:50 mixture by weight of $[CH_3(CH_2)_{16}C(O)O]_2$ and 1-hexadecyne ($CH_3(CH_2)_{13}CCH$). The combined silicon and 50:50 mixture is heated to 100° C. for approximately one hour, then rinsed with solvents and sonicated in methylene chloride. The molecular layer formed with the diacylperoxide/alkyne mixture are highly ordered, methyl terminated long chain molecular moieties, similar to those produced in example 2.

EXAMPLE 4

A silicon surface prepared in the manner described above, was placed in a quartz reaction vessel containing degassed, 1-heptadecene ($CH_3(CH_2)_{14}CH=CH_2$). The silicon surface was then irradiated for approximately twenty minutes with a 300 watt Xenon lamp placed approximately 4 inches away from the reaction vessel. The silicon surface was subsequently rinsed with solvents and sonicated in the manner described above. FTIR and wetting measurements indicated that the resulting molecular layer formed an ordered hydrocarbon layer on the silicon surface.

EXAMPLE 5

A silicon surface prepared in the standard manner was combined with a mixture of 1-heptadecene (10% by weight) and cyclooctane (90% by weight) in a quartz reaction vessel. Each side of the silicon surface was irradiated for about thirty minutes by a 300 watt xenon lamp located approximately 4 inches from the quartz reaction vessel. FTIR spectra and wetting measurements of the resulting surface indicated that a methyl terminated molecular layer had formed that was slightly less ordered (asymmetric methylene absorption peak at 2921.6 cm$^{-1}$) than the molecular layers formed by the longer chain molecular moieties in examples 1-4.

EXAMPLE 6

A silicon surface prepared as above is placed in a quartz reaction vessel which is evacuated to below 5 mtorr. The silicon surface is positioned below a cold finger which is charged with liquid nitrogen-cooled solid and liquid decane. Azomethane ($CH_3$—N=N—$CH_3$) is then released into reaction vessel to a pressure of approximately 10 mtorr where it condenses onto the cold finger and subsequently drips onto the silicon surface. Each side of the silicon surface is irradiated for approximately ten minutes using the xenon lamp in the manner described above, while receiving the condensed azomethane. The resulting silicon surface has a brownish appearance following irradiation, which is removed by rinsing and sonicating the surface. FTIR spectra indicate that the molecular layer formed includes methyl and other short chain alkyl groups bonded to the silicon surface. The presence of alkyl chains longer than simple methyl groups suggests that surface methyl groups undergo further reaction with the light activated azomethane to form longer chains bonded to the silicon surface.

EXAMPLE 7

A silicon surface prepared as above is combined with a 50:50 mixture of [CH$_3$(CH$_2$)$_{10}$C(O)O]$_2$ and ω-chloro-1-undecene in a reaction vessel, and the combination is heated to approximately 100° C. for about an hour. The surface is then rinsed and sonicated. Ellipsometry indicates a less ordered surface molecular layer (CH$_2$ asymmetric stretch at 2922.0 cm$^{-1}$) having a thickness of approximately 14 Å. Surface wetting measurements indicate that a significant number of the surface bound molecular moieties are terminated by —CH$_2$Cl groups.

EXAMPLE 8

A silicon surface is prepared as describe above and combined with neat [CH$_3$(CH$_2$)$_{11}$O]$_2$ in a reaction vessel. The reaction vessel is heated to approximately 90° C. for about twelve hours, then rinsed and sonicated as before. XPS indicates that no significant SiO$_2$ is present on the treated surface. FTIR spectra indicate a crystalline like molecular layer which may be removed by treating the surface with hot methylene chloride that has not been treated to remove dissolved water. This is consistent with the presence of a hydrolyzable Si—O—R type bond between the molecular layer and the surface silicon atoms.

The method of the present invention is also suitable for forming up to a monomolecular layer coverage of selected molecular moieties on oxidized silicon surfaces. Here, the method of the present invention employs a reducing agent to hydrogenate the SiO$_2$ overlayer prior to applying the reactions detailed above.

Figure 15:
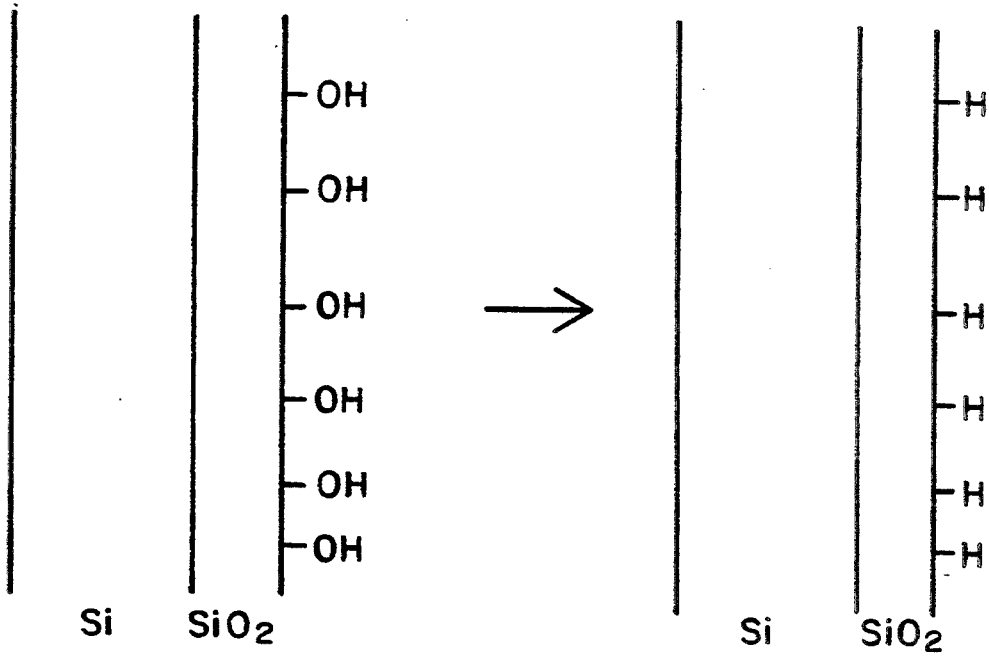
FIG. 15 is a schematic diagram of an oxidized silicon surface before and after hydrogenation of the surface silicon atoms by a reducing agent.

Referring to FIG. 15, there is shown an oxidized silicon surface before and after reduction. Suitable reducing agents for the present invention are, for example, NaBH$_4$ and LiAlH$_4$. Once reduced SiO$_2$ surface 120 has been generated, the reactions detailed above for covalently bonding selected molecular moieties 44 to clean and hydrogenated silicon surfaces, may be applied to it. For example, wetting reduced SiO$_2$ surface 120 with a free radical-producing compound, an unsaturated compound, or a combination of free radical-producing compounds and unsaturated compounds, and initiating reaction using electromagnetic radiation or heat results in molecular layers covalently bonded to the surface silicon atoms of the SiO$_2$ surface 10 with selected molecular moieties 44. The present invention thus allows a broad array of molecular moieties 44 to be covalently bonded to silicon atoms in the SiO$_2$ overlayer.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for producing a silicon surface having a molecular layer of selected molecular moieties covalently bonded to the silicon surface, the method comprising the steps of:
   etching the silicon surface to eliminate any oxidized silicon from the silicon surface;
   combining the etched silicon surface with a free radical-producing compound, with free radicals produced by the free radical-producing compound corresponding to the selected molecular moieties; and
   initiating a reaction between the free radical-producing compound and the etched silicon surface, whereby the molecular moieties corresponding to the free radicals of the free radical-producing compound are covalently bonded to the silicon surface.

2. The method of claim 1, wherein the etching step employs an etching agent selected from the group consisting of HF, NH$_4$F, water, and aqueous bases to produce a hydrogenated silicon surface.

3. The method of claim 1, wherein the etching step is a plasma etch, ion etch, sputtering, or sublimation process to produce a clean silicon surface.

4. The method of claim 1, wherein the step of initiating the reaction between the free radical-producing compound and the etched silicon surface comprises heating the combined etched silicon surface and the free radical-producing compound to a temperature sufficient to induce the reaction.

5. The method of claim 1, wherein the step of initiating the reaction between the free radical-producing compound and the etched silicon surface comprises exposing the silicon surface wetted with the free radical-producing compound to electromagnetic radiation in the ultraviolet, visible, infrared, or microwave wavelength regions.

6. The method of claim 1, wherein the free radical-producing compound is a diacylperoxide having the formula:

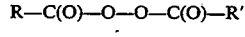

R—C(O)—O—O—C(O)—R' where R and R' are each selected from the group consisting of substituted and unsubstituted organic radicals.

7. The method of claim 6, wherein the substituted and unsubstituted organic radicals are selected from the group consisting of: alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano organic radicals.

8. The method of claim 1, wherein the free radical-producing compound is a diacylperoxide having the formula:

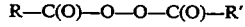

R—C(O)—O—O—C(O)—R' where R is hydrogen and R' is a substituted or unsubstituted alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, or cyano organic radical.

9. The method of claim 1, wherein the free radical-producing compound is a dialkylperoxide having the formula:

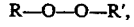

R—O—O—R', where R is hydrogen and R' is a substituted or unsubstituted alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, or cyano organic radical.

10. The method of claim 1, wherein the free radical producing compound is a dialkylperoxide having the formula:

R—O—O—R' where R and R' are each selected from the group consisting of substituted and unsubstituted organic radicals.

11. The method of claim 10, wherein the substituted and unsubstituted organic radicals are selected from the group consisting of alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano organic radicals.

12. The method of claim 1, wherein the free radical-producing compound is an azo compound having the formula:

R—N=N—R' where R and R' are selected from the group consisting of substituted and unsubstituted organic radicals.

13. The method of claim 12, wherein the substituted and unsubstituted organic radicals are selected from the group consisting of alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano organic radicals.

14. The method of claim 1, wherein the free radical-producing compound is an azo compound having the formula:

R—N=N—R' where R is hydrogen and R' is selected from the group consisting of substituted and unsubstituted organic radicals.

15. The method of claim 14, wherein the organic radical is selected from the group consisting of alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano organic radicals.

16. The method of claim 1, comprising the additional step of combining the etched silicon surface and the free radical-producing compound with an unsaturated compound, prior to the initiation step.

17. The method of claim 16, wherein the unsaturated compound is selected from the group consisting of alkene compound, alkyne compounds, and cyano compounds.

18. A silicon surface having a molecular layer of selected molecular moieties bonded to the silicon surface produced by the method of claim 1.

19. A method for producing a silicon surface having a molecular layer of selected molecular moieties covalently bonded to the silicon surface, the method comprising the steps of:
   etching the silicon surface to eliminate any oxidized silicon from the silicon surface;
   combining the etched silicon surface with an unsaturated compound having a structure such that addition of a silicon bond to the site of unsaturation yields the selected molecular moiety to be covalently bonded to the silicon surface; and
   initiating a reaction between the unsaturated compound and the etched silicon surface, whereby the molecular moieties at the sites of unsaturation of the unsaturated compound are covalently bonded to the silicon surface.

20. The method of claim 19, wherein the etching step employs an etching agent selected from the group consisting of HF, NH$_4$F, water, and aqueous bases to produce a hydrogenated silicon surface.

21. The method of claim 19, wherein the initiating step comprises exposing the combined silicon surface and unsaturated compound to radiation in the ultraviolet, visible, infrared, or microwave region of the electromagnetic spectrum.

22. The method of claim 19, wherein the initiating step comprises heating the combined silicon surface and unsaturated compound to a temperature sufficient to induce a reaction.

23. The method of claim 19, wherein the unsaturated compound is selected from the group consisting of substituted and unsubstituted alkenes having the formula

R(R')C=C(R'')R''' where R, R', R'', and R''' are the same or different and are hydrogen or substituted or unsubstituted alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano radicals.

24. The method of claim 19, wherein the unsaturated compound is selected from the group consisting of substituted and unsubstituted alkynes having the formula

R—C≡C—R' where R and R' are the same or different and are hydrogen or substituted or unsubstituted alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano radicals.

25. The method of claim 19, wherein the unsaturated compound is selected from the group consisting of substituted and unsubstituted cyano compounds having the formula

R—C≡N where R is a substituted or unsubstituted alkyl, alkenyl, aryl, cycloalkyl, cycloalkenyl, alkanoyl, alkylthioalkyl, alkylaryl, arylalkyl, alkylsulfinyl, alkoxyalkyl, alkylsulfonyl, arylsulfinyl, alkoxycarbonyl, alkylsilyl, arylsulfonyl, carboxylic acid, halogen, and cyano radical.

26. The silicon surface having a molecular layer of selected molecular moieties covalently bonded to the silicon surface produced by the method of claim 19.

27. A composition comprising a silicon material having a surface and long chain substituted or unsubstituted alkyl groups covalently bonded to the surface of the silicon material.

28. The composition of claim 16, wherein the long chain alkyl groups have the formula:

CH$_3$—(CH$_2$)$_n$— where n is $\geq 0$.

29. A method for producing an oxidized silicon surface having a molecular layer of selected molecular moieties covalently bonded to the silicon surface, the method comprising the steps of:

applying a reducing agent to the oxidized silicon surface to hydrogenate the silicon oxide surface;

combining the hydrogenated silicon oxide surface with a free radical-producing compound, with free radicals produced by the free radical-producing compound corresponding to the selected molecular moieties; and initiating a reaction between the free radical-producing compound and the hydrogenated silicon oxide surface, whereby the molecular moieties corresponding to the free radicals of the free radical-producing compound are covalently bonded to the silicon oxide surface.

30. The method of claim 29, wherein the reducing agent is selected from the group consisting of $LiAlH_4$ and $NaBH_4$.

31. A method for producing a silicon oxide surface having a molecular layer of selected molecular moieties covalently bonded to the silicon oxide surface, the method comprising the steps of:

subjecting the silicon oxide surface to a reducing agent to hydrogenate the silicon oxide surface;

combining the hydrogentaed silicon oxide surface with an unsaturated compound having a structure such that addition of a silicon bond to the site of unsaturation yields the selected molecular moiety to be covalently bonded to the silicon oxide surface; and initiating a reaction between the unsaturated compound and the hydrogenated silicon oxide surface, whereby the molecular moieties connected to the site of unsaturation of the unsaturated compound are covalently bonded to the silicon oxide surface.

32. A method for producing a silicon surface having a selected polymer covalently bonded to the silicon surface, the method comprising the steps of:

etching the silicon surface to remove oxidized silicon from the silicon surface;

combining the silicon surface with a mixture of a free radical producing compound and an unsaturated compound having a structure corresponding to the monomers of the selected polymer;

inducing a polymerization reaction between the silicon surface and the unsaturated compound with the free radical generating compound, to form the selected polymer covalently bonded to the silicon surface.

33. The method of claim 32, wherein the step of inducing a polymerization reaction between the silicon surface and the unsaturated compound comprises heating the silicon surface and the mixture of the free radical producing compound and the unsaturated compound to a temperature sufficient to generate free radicals from the free radical producing compound.

34. The method of claim 32, wherein the step of inducing a polymerization reaction between the silicon surface and the unsaturated compound comprises exposing the silicon surface and the mixture of the free radical-producing compound and the unsaturated compound to electromagnetic radiation having wavelengths selected to generate free radicals from the free radical producing compound.

35. A silicon surface having a selected polymer bonded to the silicon surface as produced by the method of claim 32.

36. A method for producing a silicon oxide surface having a selected polymer covalently bonded to the silicon oxide surface, the method comprising the steps of:

applying a reducing agent to the silicon oxide surface to hydrogenate the silicon oxide surface;

combining the hydrogenated silicon oxide surface with a mixture of a free radical producing compound and an unsaturated compound having a structure corresponding to the monomers of the selected polymer; and inducing a polymerization reaction between the silicon oxide surface and the unsaturated compound with the free radical generating compound, to form the selected polymer covalently bonded to the silicon oxide surface.

37. The method of claim 36, wherein the step of inducing a polymerization reaction between the silicon oxide surface and the unsaturated compound comprises heating the hydrogenated silicon oxide surface and the mixture of the free radical producing compound and the unsaturated compound to a temperature sufficient to generate free radicals from the free radical producing compound.

38. The method of claim 36, wherein the step of inducing a polymerization reaction between the silicon oxide surface and the unsaturated compound comprises exposing the hydrogenated silicon oxide surface and the mixture of the free radical producing compound and the unsaturated compound to electromagnetic radiation at wavelengths selected to generate free radicals from the free radical producing compound.

39. A silicon oxide surface having layers of a selected polymer covalently bonded to the silicon oxide surface as produced by the method of claim 36.

* * * * *